United States Patent
Lee et al.

(10) Patent No.: US 8,741,162 B2
(45) Date of Patent: Jun. 3, 2014

(54) METHOD OF MANUFACTURING NANOIMPRINT STAMP

(71) Applicant: Samsung Electronics Co., Ltd., Suwon-Si (KR)

(72) Inventors: Byung-kyu Lee, Seoul (KR); Du-hyun Lee, Suwon-si (KR); Woong Ko, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 14/072,116

(22) Filed: Nov. 5, 2013

(65) Prior Publication Data
US 2014/0054264 A1 Feb. 27, 2014

Related U.S. Application Data (62) Division of application No. 13/170,766, filed on Jun. 28, 2011, now Pat. No. 8,603,349.

(30) Foreign Application Priority Data

Dec. 15, 2010 (KR) .................. 10-2010-0128624

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC ........................................... 216/44; 977/887

(58) Field of Classification Search
CPC ............................ G03F 7/0002; B82Y 40/00
USPC ................................ 216/22, 41, 44; 977/887
See application file for complete search history.

(56) References Cited

U.S. PATENT DOCUMENTS

| | | | |
|---|---|---|---|
| 5,699,848 A | 12/1997 | Lee et al. | |
| 7,028,743 B1 * | 4/2006 | Wang et al. | 164/46 |
| 2004/0202865 A1 * | 10/2004 | Homola et al. | 428/421 |
| 2010/0308009 A1 | 12/2010 | Zhu et al. | |

FOREIGN PATENT DOCUMENTS

| | | |
|---|---|---|
| JP | 11053777 A | 2/1999 |
| JP | 2008254413 A | 10/2008 |
| JP | 2009298068 A | 12/2009 |
| KR | 100930925 B1 | 12/2009 |
| KR | 1020100033560 | 3/2010 |

* cited by examiner

*Primary Examiner* — Roberts Culbert
(74) *Attorney, Agent, or Firm* — Harness, Dickey & Pierce, P.L.C.

(57) ABSTRACT

Methods of manufacturing a nanoimprint stamp are provided. The method may include forming a pattern on a surface of a master substrate, depositing an etch barrier layer on a surface of a stamp substrate, coating a photoresist on one of the surfaces of the master substrate and the stamp substrate on which an etch barrier layer is formed, forming a photoresist pattern by pressing the master substrate against the stamp substrate, forming a hard mask by etching the etch barrier layer using the photoresist pattern, and etching the stamp substrate using the hard mask as an etch mask.

18 Claims, 10 Drawing Sheets

METHOD OF MANUFACTURING NANOIMPRINT STAMP

CROSS-REFERENCE TO RELATED APPLICATIONS

This application is a divisional of U.S. application Ser. No. 13/170,766, filed on Jun. 28, 2011, which claims priority under 35 U.S.C. §119 to Korean Patent Application No. 10-2010-0128624, filed on Dec. 15, 2010, in the Korean Intellectual Property Office (KIPO), the disclosure of each of which is incorporated herein in their entirety by reference.

BACKGROUND

1. Field

Example embodiments relate to methods of manufacturing nanoimprint stamps, and more particularly, to methods of manufacturing nanoimprint stamps using master stamps.

2. Description of the Related Art

A nanoimprint process is a process of repeatedly copying a pattern by printing the pattern on a surface of an object using a stamp on which the pattern is formed.

In the nanoimprint process that uses ultraviolet rays, the stamp is formed of a transparent material so that ultraviolet rays can pass therethrough, and a reverse image of a pattern to be stamped is formed on a surface of the stamp in a protruded structure. After directly pressing a photoresist coated on a substrate with the stamp, the photoresist is hardened via ultraviolet rays, and afterwards, the pattern on the stamp is transferred onto the photoresist.

Since the stamp must resist to a predetermined pressure and is exposed to a large amount of ultraviolet rays, the stamp is formed of a material having high hardness and small deformation such as quartz or glass.

Conventionally, electron beam lithography is performed to manufacture a stamp. A long electron beam recording time is required for forming a pattern having a few nm to a few tens of nm on a surface of the stamp.

When electron beam recording is performed on a surface of quartz, a patterning process for recording a pattern having less than 20 nm is difficult. Also, when manufacturing multiple numbers of stamps having the same pattern, it is difficult to obtain stamps having the same pattern due to variations of the electron beam recording conditions and etching conditions.

SUMMARY

Provided are methods of manufacturing nanoimprint stamps by transferring a precise nanopattern from a master substrate to the stamps.

Additional aspects will be set forth in part in the description which follows and, in part, will be apparent from the description, or may be learned by practice of the presented embodiments.

In accordance with example embodiments, a method of manufacturing a nanoimprint stamp may include forming a pattern on a surface of a master substrate, depositing an etch barrier layer on a surface of a stamp substrate, coating a photoresist on one of the surface of the master substrate and the surface of the stamp substrate, pressing the master substrate against the stamp substrate to compress the photoresist, forming a photoresist pattern on the stamp substrate by hardening the photoresist, forming a hard mask on the stamp substrate by etching the etch barrier layer using the photoresist pattern, and etching the stamp substrate using the hard mask as an etch mask.

In accordance with example embodiments, a method of manufacturing a nanoimprint stamp may include forming a pattern on a surface of a master substrate, coating a photoresist on one of a surface of a stamp substrate and the surface of the master substrate, pressing the master substrate against the stamp substrate to compress the photoresist, forming a photoresist pattern on the stamp substrate by hardening the photoresist, and etching the stamp substrate using the photoresist pattern as an etch mask.

In accordance with example embodiments, a method of manufacturing a nanoimprint stamp may include forming a pattern on a surface of a master substrate, coating a first photoresist on one of a surface of a first stamp substrate and the surface of the master substrate, pressing the master substrate against the first stamp substrate to compress the photoresist, forming a first photoresist pattern on the first stamp substrate by hardening the first photoresist, removing the master substrate, coating a second photoresist on one of surfaces of the first photoresist pattern and a second stamp substrate, pressing the first stamp substrate against the second stamp substrate to compress the second photoresist, forming a second photoresist pattern on the second stamp substrate by hardening the second photoresist, removing the first stamp substrate, and etching the second stamp substrate using the second photoresist pattern as an etch mask.

In accordance with example embodiments, a method of manufacturing a nanoimprint stamp may include forming a pattern on a surface of a master substrate, coating a first photoresist on one of the surface of the master substrate and a surface of a first stamp substrate, pressing the master substrate against the first stamp substrate to compress the first photoresist, forming a first photoresist pattern on the first stamp substrate by hardening the first photoresist, removing the master substrate, depositing an etch barrier layer on a surface of a second stamp substrate, coating a second photoresist on one of surfaces of the first photoresist pattern and the etch barrier layer, pressing the first stamp substrate against the second stamp substrate to compress the second photoresist, forming a second photoresist pattern on the second stamp substrate by hardening the second photoresist, removing the first stamp substrate, forming a hard mask by etching the etch barrier layer using the second photoresist pattern, and etching the second stamp substrate using the hard mask as an etch mask.

According to example embodiments, there is provided a method of manufacturing a nanoimprint stamp. In example embodiments, the method may include forming a pattern on a surface of a master substrate, depositing an etch barrier layer on a surface of a stamp substrate, coating a photoresist on one of the surfaces of the master substrate and the stamp substrate, pressing the master substrate against the stamp substrate, forming a photoresist pattern formed of the photoresist on the stamp substrate by hardening the photoresist, forming a hard mask by etching the etch barrier layer using the photoresist pattern, and etching the stamp substrate using the hard mask as an etch mask.

The etch barrier layer may be formed of one of a metal film, an oxide film, and a nitride film.

The etch barrier layer may be formed of a material selected from the group consisting of the metal selected from the group consisting of Cr, Ti, Ta, Pt, Au, and Mo and a metal oxide or a metal nitride that is formed by combining oxygen or nitrogen with the first metal.

The etch barrier layer may be formed to have a thickness in a range from about 1 nm to about 20 nm.

The etch barrier layer may be formed of a material selected from the group consisting of $SiO_2$, indium tin oxide (ITO), and $Si_3N_4$.

The master substrate may be a silicon substrate.

The stamp substrate may be formed of a material selected from the group consisting of quartz, glass, and polymer.

The photoresist may be an ultraviolet ray hardening photoresist, and the hardening of the photoresist may include irradiating ultraviolet rays onto the stamp substrate.

According to example embodiments, there is provided a method of manufacturing a nanoimprint stamp. In example embodiments the method may include forming a pattern on a surface of a master substrate, coating a photoresist on one of a surface of a stamp substrate and the surface of the master substrate, pressing the master substrate against the stamp substrate, forming a photoresist pattern formed of the photoresist on the stamp substrate by hardening the photoresist, and etching the stamp substrate using the photoresist pattern as an etch mask.

According to example embodiments, there is provided a method of manufacturing a nanoimprint stamp. In example embodiments the method may include forming a pattern on a surface of a master substrate, coating a first photoresist on one of a surface of a first stamp substrate and the surface of the master substrate, pressing the master substrate against the first stamp substrate, forming a first photoresist pattern formed of the first photoresist on the first stamp substrate by hardening the first photoresist, removing the master substrate, coating a second photoresist on one of surfaces of the first photoresist pattern and a second stamp substrate, pressing the first stamp substrate against the second stamp substrate, forming a second photoresist pattern formed of the second photoresist on the second stamp substrate by hardening the second photoresist, removing the first stamp substrate, and etching the second stamp substrate using the second photoresist pattern as an etch mask.

According to example embodiments, there is provided a method of manufacturing a nanoimprint stamp. In example embodiments the method may include forming a pattern on a surface of a master substrate, coating a first photoresist on one of the surface of the master substrate and a surface of a stamp substrate, pressing the master substrate against the first stamp substrate, forming a first photoresist pattern formed of the first photoresist on the first stamp substrate by hardening the first photoresist, removing the master substrate, depositing an etch barrier layer on a surface of the second stamp substrate, coating a second photoresist on one of surfaces of the first photoresist pattern and the second stamp substrate, pressing the first stamp substrate against the second stamp substrate, forming a second photoresist pattern formed of the second photoresist on the second stamp substrate by hardening the second photoresist, removing the first stamp substrate, forming a hard mask by etching the etch barrier layer using the second photoresist pattern, and etching the second stamp substrate using the hard mask as an etch mask.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments, examples of which are illustrated in the accompanying drawings. However, example embodiments may have different forms and should not be construed as being limited to the descriptions set forth herein. Accordingly, example embodiments are merely described below, by referring to the figures, to explain aspects of the present description. In the drawings, like reference numerals refer to the like elements throughout, and lengths and sizes of elements and regions may be exaggerated for clarity and convenience of explanation.

FIGS. 1A through 1G are sequential cross-sectional views for explaining a method of manufacturing a nanoimprint stamp according to example embodiments.

Figure 1A:
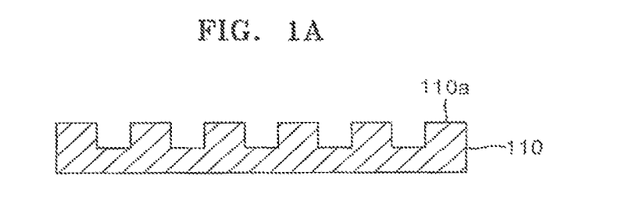
FIGS. 1A through 1G are sequential cross-sectional views for explaining a method of manufacturing a nanoimprint stamp according to example embodiments.

Referring to FIG. 1A, a master substrate 110 may be fabricated by forming a pattern on a substrate, for example, a silicon substrate. The master substrate 110 may be formed by a conventional method, for example, electron-beam lithography, photo lithography, interference lithography, or self assembly lithography. The pattern may be formed on a first surface 110a of the master substrate 110.

Figure 1B:
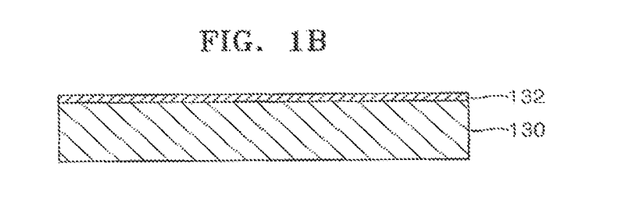

Referring to FIG. 1B, an etching barrier layer 132 may be formed on a stamp substrate 130. The stamp substrate 130 may be a substrate where the pattern of the master substrate 110 is transferred thereto. A nanoimprint process may be performed by using the stamp substrate 130. The stamp substrate 130 may be formed of quartz, glass, or a polymer having a high hardness. The polymer having the high hardness may be an acrylate group polymer, a urethane group polymer, or a silicon containing polymer.

The etching barrier layer 132 may be a metal thin film formed of a metal, for example, chrome Cr, titanium Ti, tantalum Ta, platinum Pt, gold Au, or molybdenum Mo (or an oxide or a nitride of these metals). In example embodiments, the metal thin film may be formed to a thickness in a range from about 1 nm to about 20 nm by a conventional deposition method. The metal thin film may have an ultraviolet (UV) transmissivity greater than 20%.

The etch barrier layer 132 may be formed of an oxide or a nitride. For example, the etch barrier layer 132 may be formed of chrome oxide, silicon oxide, indium tin oxide (ITO), or silicon nitride. The etching barrier layer 132 formed of these oxides or the silicon nitride may be formed to a thickness having an UV transmissivity greater than 50%.

Figure 1C:
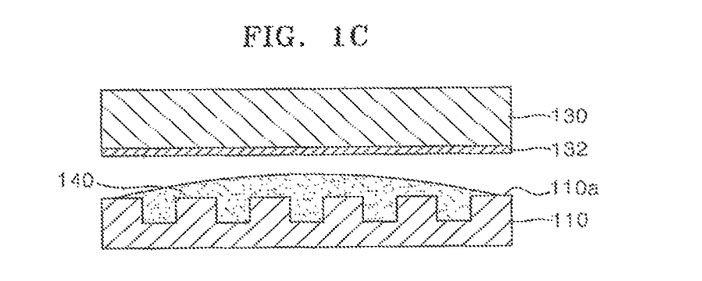

Referring to FIG. 1C, a photoresist 140 that can be hardened by ultraviolet rays may be coated on the first surface 110a of the master substrate 110 on which the pattern is formed using a spin coating method, a dispensing method, or a dipping method. Although FIG. 1C illustrates the photoresist 140 as being formed on the master substrate 110, example embodiments are not limited thereto. For example, the photoresist 140 may alternatively be formed on the etch barrier 132.

The stamp substrate 130 may then be pressed against the master substrate 110. At this point, the etch barrier layer 132 of the stamp substrate 130 faces the photoresist 140.

Figure 1D:
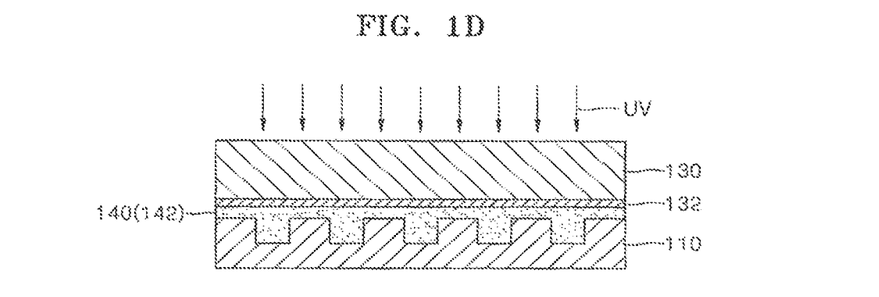

Referring to FIG. 1D, the photoresist 140 may be hardened by irradiating ultraviolet rays UV onto the stamp substrate 130. As a result, the pattern of the master substrate 110 is transferred to the photoresist 140 using a nanoimprint process. The photoresist 140 on which the pattern is transferred is referred to as a photoresist pattern 142.

Figure 1E:
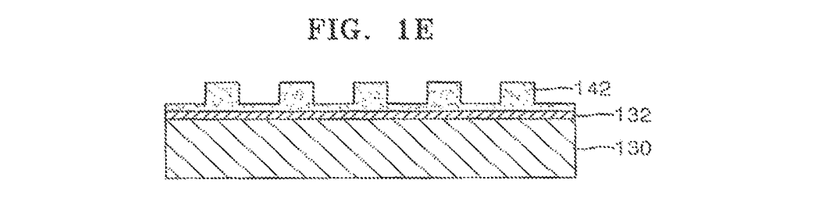

Referring to FIG. 1E, the master substrate 110 may be detached from the stamp substrate.

Figure 1F:
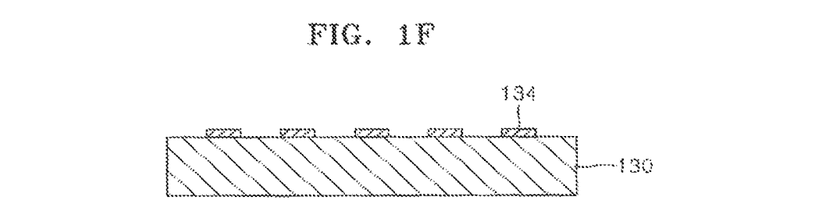

Referring to FIG. 1F, the etch barrier layer 132 may be etched using the photoresist pattern 142 as an etch mask, and the etched etch barrier layer 132 is referred to as a hard mask 134.

Figure 1G:
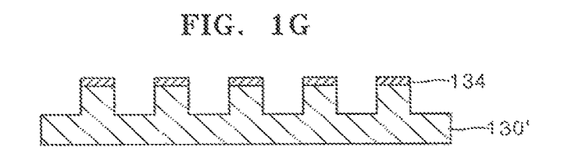

Referring to FIG. 1G, the stamp substrate 130 may be etched using the hard mask 134 as an etch mask in a dry or wet etching method. When the hard mask 134 is removed, a stamp 130' having a pattern on a surface thereof is manufactured. The pattern of the manufactured stamp 130' is a reverse image of the pattern of the master substrate 110.

FIGS. 2A through 2E are sequential cross-sectional views for explaining a method of manufacturing a nanoimprint stamp according to example embodiments.

Figure 2A:
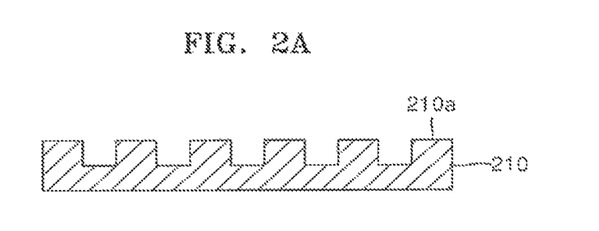
FIGS. 2A through 2E are sequential cross-sectional views for explaining a method of manufacturing a nanoimprint stamp according to example embodiments.

Referring to FIG. 2A, a master substrate 210 may be fabricated by forming a pattern on a substrate, for example, a silicon substrate. The master substrate 210 may be formed by a conventional method, for example, electron-beam lithography, photo lithography, interference lithography, or self assembly lithography. The pattern may be formed on a first surface 210a of the master substrate 210 as shown in FIG. 2A.

Figure 2B:
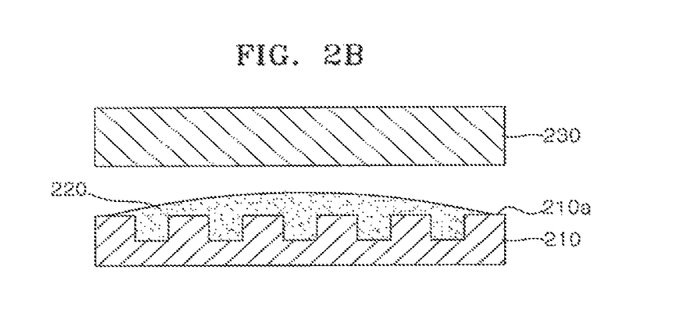

Referring to FIG. 2B, a photoresist 220 that can be hardened by ultraviolet rays may be coated on the first surface 210a of the master substrate 210 on which the pattern is formed using a spin coating method, a dispensing method, or a dipping method. The photoresist 220 may be formed of a material having an etch-selectivity with a stamp substrate 230. Although FIG. 2B illustrates the photoresist 220 as being formed on the first surface 210a of the master substrate 210, example embodiments are not limited thereto. For example, the photoresist 220 may alternatively be formed on the stamp substrate 230.

The stamp substrate 230 may be pressed against the master substrate 210. At this point, the stamp substrate 230 faces the first surface 210a of the master substrate 210 on which the photoresist 220 is formed. The pattern of the master substrate 210 may be transferred to the stamp substrate 230. The stamp substrate 230 may be formed of quartz, glass, or a polymer having a high hardness. The polymer having the high hardness may be acrylate group polymer, a urethane group polymer, or a silicon containing polymer.

Figure 2C:
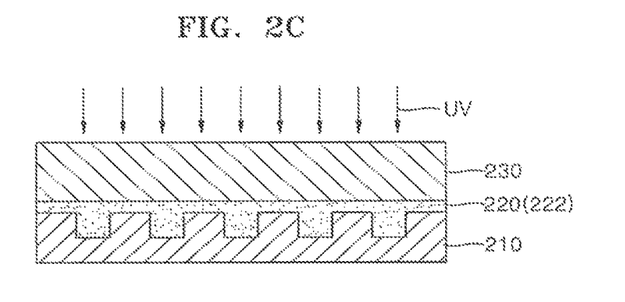

Referring to FIG. 2C, the photoresist 220 may be hardened by irradiating ultraviolet rays UV onto the stamp substrate 230. As a result, the pattern of the master substrate 210 may be transferred to the photoresist 220 using a nanoimprint process. The photoresist 220 on which the pattern is transferred may be referred to as a photoresist pattern 222. The photoresist pattern 222 may be formed of a material having etch selectivity with respect to the stamp substrate 230. The photoresist pattern 222 may have an aspect ratio of greater than 2.

Figure 2D:
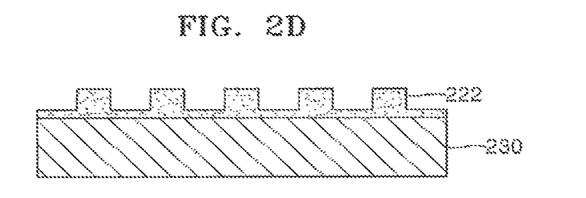

Referring to FIG. 2D, after detaching the master substrate 210 from the stamp substrate 230, the stamp substrate 230 may be etched using the photoresist pattern 222 as an etch mask.

Figure 2E:
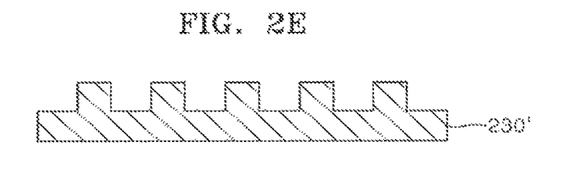

Referring to FIG. 2E, when the photoresist pattern 222 is removed, a stamp 230' having a pattern on a surface thereof is manufactured. The pattern of the manufactured stamp 230' is a reverse image of the pattern of the master substrate 210.

FIGS. 3A through 3G are sequential cross-sectional views for explaining a method of manufacturing a nanoimprint stamp according to example embodiments.

Figure 3A:
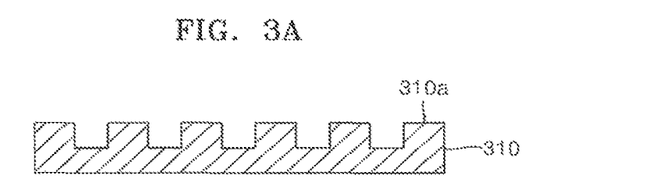
FIGS. 3A through 3G are sequential cross-sectional views for explaining a method of manufacturing a nanoimprint stamp according to example embodiments.

Referring to FIG. 3A, a master substrate 310 may be fabricated by forming a pattern on a substrate, for example, a silicon substrate. The master substrate 310 may be formed by a conventional method, for example, electron-beam lithography, photo lithography, interference lithography, or self assembly lithography. The pattern may be formed on a first surface 310a of the master substrate 310.

Figure 3B:
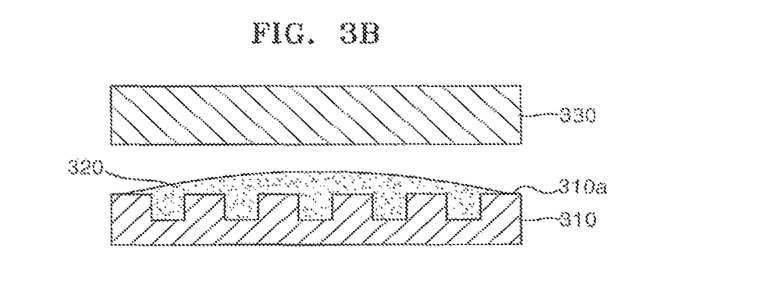

Referring to FIG. 3B, a first photoresist 320 that can be hardened by ultraviolet rays may be coated on the first surface 310a of the master substrate 310 using a spin coating method, a dispensing method, or a dipping method. The first photoresist 320 may be formed of a material having an etch selectivity with respect to a first stamp substrate 330. Although FIG. 3B illustrates the first photoresist 320 as being formed on the first surface 310a of the master substrate 310, example embodiments are not limited thereto. For example, the first photoresist 320 may be formed on the first stamp substrate 330.

The first stamp substrate 330 may be pressed against the master substrate 310. At this point, the first stamp substrate 330 faces the first surface 310a of the master substrate 310 on which the first photoresist 320 is formed. The pattern of the master substrate 310 may be transferred to the first stamp substrate 330. The first stamp substrate 330 may be formed of quartz, glass, or a polymer having a high hardness. The polymer having the high hardness may be acrylate group polymer, a urethane group polymer, or a silicon containing polymer.

Figure 3C:
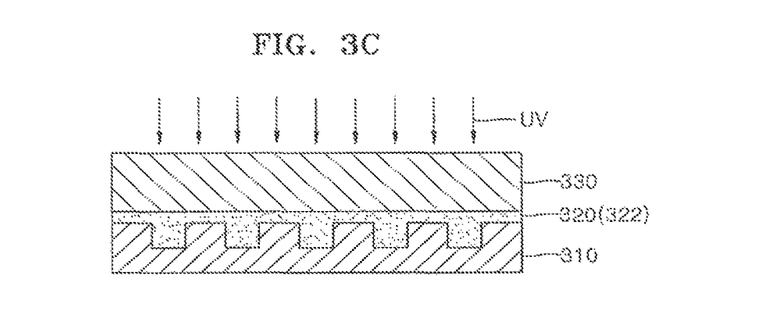

Referring to FIG. 3C, the first photoresist 320 may be hardened by irradiating ultraviolet rays UV onto the first stamp substrate 330. As a result, the pattern of the master substrate 310 may be transferred to the first photoresist 320 using a nanoimprint process. The first photoresist 320 on which the pattern is transferred is referred to as a first photoresist pattern 322.

Figure 3D:
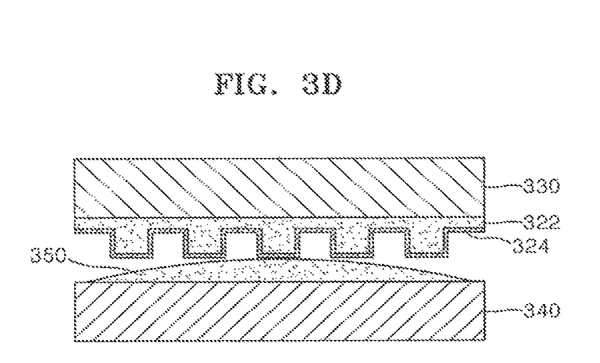

Referring to FIG. 3D, after removing the master substrate 310 from the first stamp substrate, a release coating 324 is formed on the first photoresist pattern 322. The release coating 324 may be a fluorine resin coating, for example, polytetrafluoroethylene (PTFE).

A second stamp substrate 340 is prepared. The second stamp substrate 340 may be formed of the same material as the first stamp substrate 330.

A second photoresist 350 that can be hardened by ultraviolet rays may be coated between the first stamp substrate 330 and the second stamp substrate 340. For example, the second photoresist 350 may be formed on the second stamp substrate 340 or the first photoresist pattern 322. For example, the second photoresist 350 may be formed on the release coating 324.

The second stamp substrate 340 may be pressed against the first stamp substrate 330.

Figure 3E:
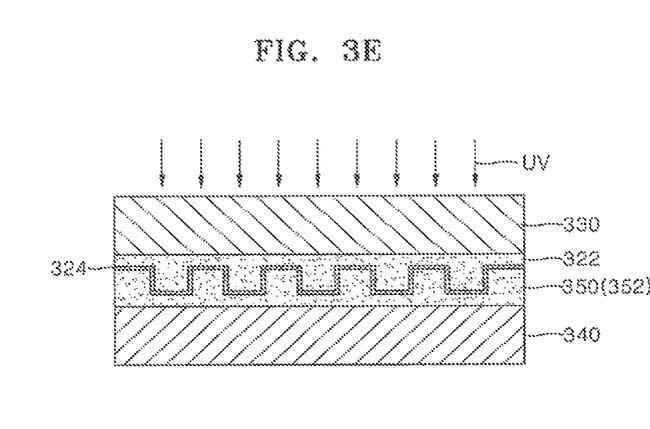

Referring to FIG. 3E, the second photoresist 350 may be hardened by irradiating ultraviolet rays UV onto the first stamp substrate 330. The ultraviolet rays UV may be irradiated onto the second stamp substrate 340. As a result, the first photoresist pattern 322 may be transferred to the second photoresist 350 using a nanoimprint process. The second photoresist 350 on which the pattern is transferred is referred to as a second photoresist pattern 352.

Figure 3F:
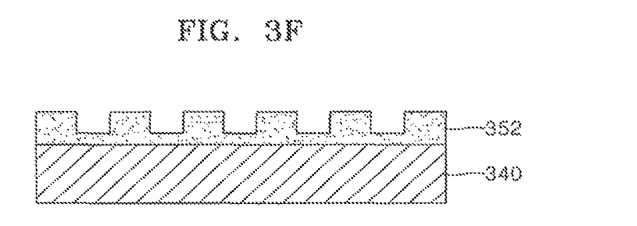

Referring to FIG. 3F, after removing the first stamp substrate 330, the first photoresist pattern 322, and the release coating 324 from the second photoresist pattern 352, the second stamp substrate 340 may be etched using the second photoresist pattern 352 as an etch mask.

Figure 3G:
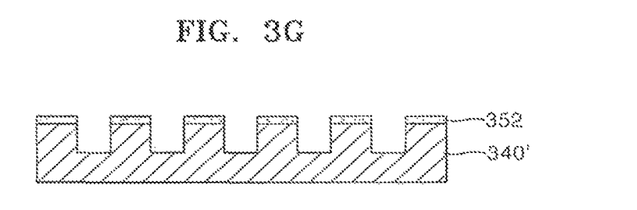

Referring to FIG. 3G, when the second photoresist pattern 352 is removed, a second stamp 340' having a pattern on a surface thereof is manufactured. The pattern of the manufactured stamp 340' has the same shape as the pattern of the master substrate 310.

The release coating 324 is used to readily separate the first photoresist pattern 322 from the second photoresist pattern 352. However, example embodiments are not limited thereto. That is, the first photoresist 320 and the second photoresist 350 may be formed of materials having release characteristics different from each other instead of using the release coating 324. For example, one of the first photoresist 320 and the second photoresist 350 may be formed of a photoresist containing fluorine, for example, fluorine resin, and the other photoresist may be formed of a photoresist that includes little fluorine.

FIGS. 4A through 4H are sequential cross-sectional views for explaining a method of manufacturing a nanoimprint stamp according to example embodiments.

Figure 4A:
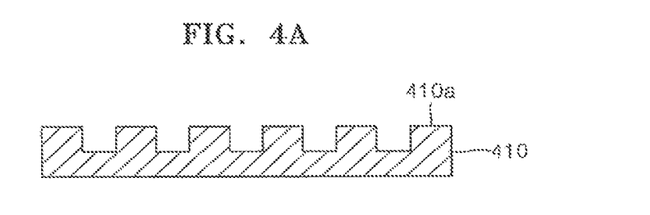
FIGS. 4A through 4H are sequential cross-sectional views for explaining a method of manufacturing a nanoimprint stamp according to example embodiments.

Referring to FIG. 4A, a master substrate 410 is fabricated by forming a pattern on a substrate, for example, a silicon substrate. The master substrate 410 may be formed by a conventional method, for example, E-beam lithography, photo lithography, interference lithography, or self assembly lithography. The pattern is formed on a first surface 410a of the master substrate 410.

Figure 4B:
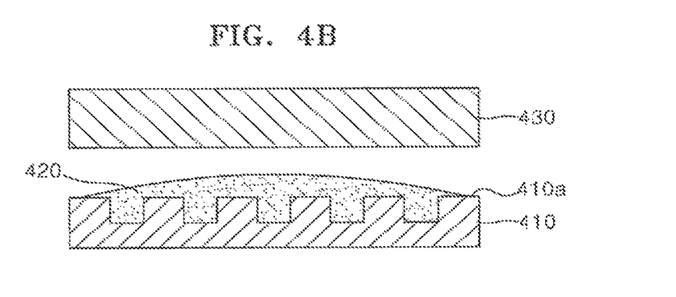

Referring to FIG. 4B, a first photoresist 420 that can be hardened by ultraviolet rays is coated on the first surface 410a of the master substrate 410 using a spin coating method, a dispensing method, or a dipping method. The first photoresist 420 may be formed of a material having an etch selectivity with a first stamp substrate 430. Although FIG. 4B illustrates the first photoresist 420 as being formed on the first surface 410a of the master substrate 410, example embodiments are not limited thereto. For example, the first photoresist 420 may be formed on the first stamp substrate 430.

The first stamp substrate 430 may be pressed against the master substrate 410. At this point, the first stamp substrate 430 faces the first surface 410a of the master substrate 410 on which the first photoresist 420 is formed. The pattern of the master substrate 410 may be transferred to the first stamp substrate 430. The first stamp substrate 430 may be formed of quartz, glass, or a polymer having a high hardness. The polymer having the high hardness may be acrylate group polymer, a urethane group polymer, or a silicon containing polymer.

Figure 4C:
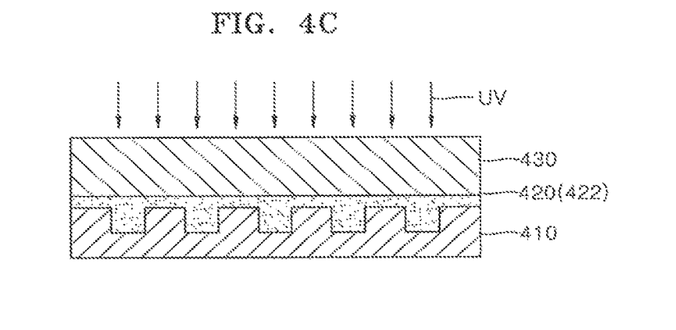

Referring to FIG. 4C, the first photoresist 420 may be hardened by irradiating ultraviolet rays UV onto the first stamp substrate 430. As a result, a reverse image of the pattern of the master substrate 410 is transferred to the first photoresist 420 using a nanoimprint process. The first photoresist 420 on which the pattern is transferred is referred to as a first photoresist pattern 422.

Figure 4D:
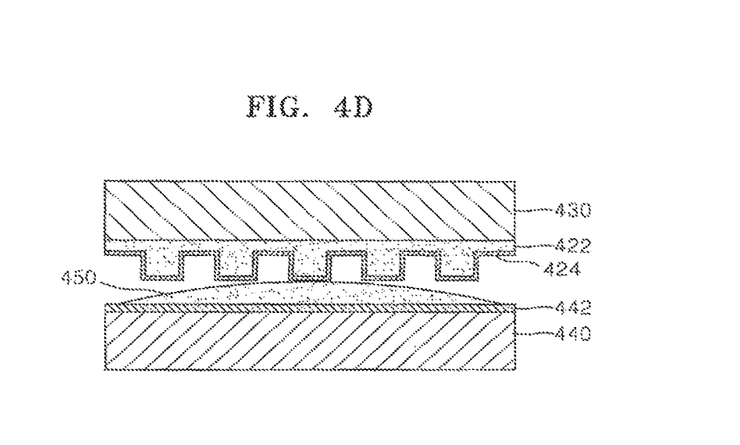

Referring to FIG. 4D, an etch barrier layer 442 may be formed on a second stamp substrate 440. The first photoresist pattern 422 may be transferred to the second stamp substrate 440. A nanoimprint process is performed using the first stamp substrate 430. The second stamp substrate 440 may be formed of quartz, glass, or a polymer having a high hardness like the first stamp substrate 430.

The etch barrier layer 442 may be a metal thin film deposited of a metal, for example, chrome Cr, titanium Ti, tantalum Ta, platinum Pt, gold Au, or molybdenum Mo (or an oxide or a nitride of these metals). In example embodiments, the etch barrier layer 442 may be formed to have a thickness in a range from about 1 nm to about 20 nm by a conventional deposition method. The metal thin film may be formed to have an ultraviolet (UV) transmissivity greater than 20%.

The etching barrier layer 442 may be formed of an oxide or a nitride, for example, chrome oxide, silicon oxide, ITO, or silicon nitride. The etching barrier layer 442 formed of these oxides (or the silicon nitride) may have a thickness having an ultraviolet (UV) transmissivity greater than 50%.

After removing the master substrate 410, a release coating 424 may be coated on the first photoresist pattern 422. The release coating 424 may be a fluorine resin coating, for example, polytetrafluoroethylene (PTFE).

A second photoresist 450 that can be hardened by ultraviolet rays may be coated between the first stamp substrate 430 and the second stamp substrate 440. In example embodiments, the second photoresist 450 may be formed on one of the first photoresist pattern 422 and the etch barrier layer 442. For example, the second photoresist 450 may be formed on the release layer 424.

The second stamp substrate 440 may be pressed against the first stamp substrate 430.

Figure 4E:
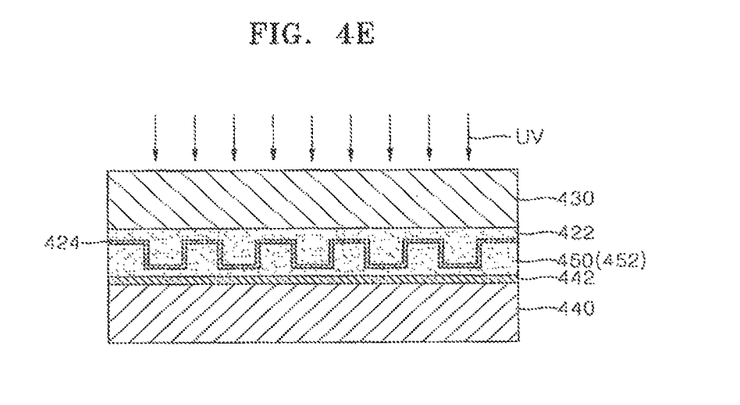

Referring to FIG. 4E, the second photoresist 450 may be hardened by irradiating ultraviolet rays UV onto the first stamp substrate 430 or the second stamp substrate 440. As a result, the pattern of the first stamp substrate 430 may be transferred to the second photoresist 450 using a nanoimprint process. The second photoresist 450 on which the pattern is transferred is referred to as a second photoresist pattern 452.

Figure 4F:
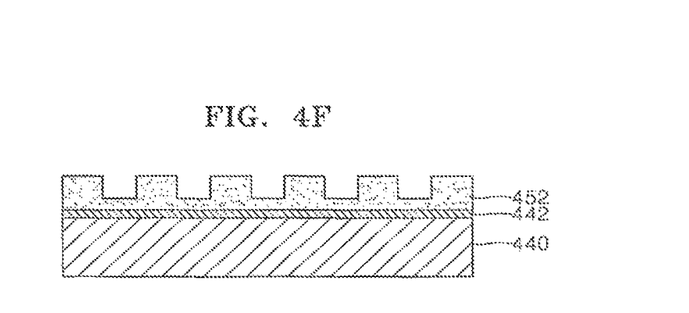

Referring to FIG. 4F, after removing the first stamp substrate 430, the first photoresist pattern 422, and the release coating 424, the etch barrier layer 442 may be etched using the second photoresist pattern 452 as an etch mask.

Figure 4G:
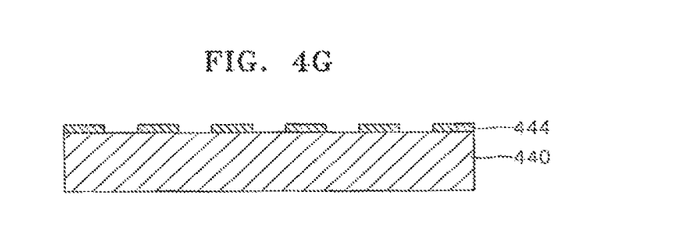
Figure 4H:
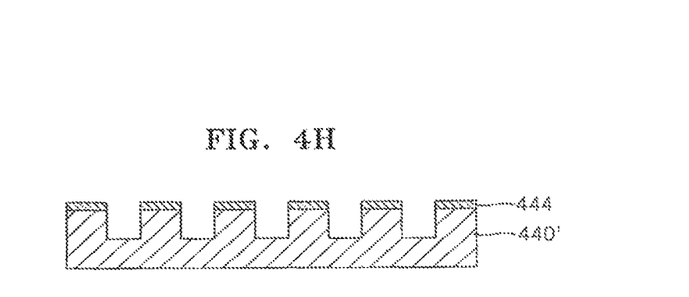

Referring to FIGS. 4G and 4H, the etched etch barrier layer 442 is referred to as a hard mask 444. The second stamp substrate 440 is etched using the hard mask 444 by using a dry or wet etch method. When the hard mask 444 is removed, a second stamp 440' having a pattern on a surface thereof is manufactured. The second stamp 440' has a pattern having the same shape as that of the master substrate 410.

The release coating 424 may be used to readily separate the first photoresist pattern 422 from the second photoresist pattern 452. However, example embodiments are not limited thereto. That is, the first photoresist 420 and the second photoresist 450 may be formed of materials having release characteristics different from each other instead of using the release coating 424. For example, one of the first photoresist 420 and the second photoresist 450 may be formed of a photoresist containing fluorine, for example, fluorine resin, and the other photoresist may be formed of a photoresist that includes little fluorine.

In the method of manufacturing a nanoimprint stamp according to example embodiments, after fabricating a master substrate on which a nano-structure pattern is formed by using a semiconductor process, the nanoimprint stamp is manufactured using the master substrate in a nanoimprint process. Therefore, a relatively precise nano-structure pattern can be formed on the nanoimprint stamp.

In the methods of manufacturing nanoimprint stamps according to example embodiments, after fabricating a master substrate on which a nano-structure pattern is formed by using a semiconductor process, a first stamp is manufactured using the master substrate in a nanoimprint process. Afterwards, a second stamp is manufactured using the first stamp in a nanoimprint process. Therefore, a precise nano-structure pattern may be formed on the second stamp which is a nanoimprint stamp. Also, a pattern identical to the pattern formed on the master substrate can be formed on the second stamp.

It should be understood that example embodiments described herein should be considered in a descriptive sense only and not for purposes of limitation. Descriptions of features or aspects within example embodiments should typically be considered as available for other similar features or aspects in other embodiments.

What is claimed is:

1. A method of manufacturing a nanoimprint stamp, the method comprising:
    forming a pattern on a surface of a master substrate;
    coating a first photoresist on one of a surface of a first stamp substrate and the surface of the master substrate;
    pressing the master substrate against the first stamp substrate to compress the first photoresist;
    forming a first photoresist pattern on the first stamp substrate by hardening the first photoresist;
    removing the master substrate;
    coating a second photoresist on one of surfaces of the first photoresist pattern and a second stamp substrate;
    pressing the first stamp substrate against the second stamp substrate to compress the second photoresist;
    forming a second photoresist pattern on the second stamp substrate by hardening the second photoresist;
    removing the first stamp substrate; and
    etching the second stamp substrate using the second photoresist pattern as an etch mask.

2. The method of claim 1, wherein the master substrate is a silicon substrate.

3. The method of claim 1, wherein each of the first and second stamp substrates includes at least one of one of quartz, glass, and polymer.

4. The method of claim 1, wherein the first photoresist is an ultraviolet ray hardening photoresist, and hardening the first photoresist includes irradiating ultraviolet rays onto the first stamp substrate.

5. The method of claim 1, wherein the second photoresist is an ultraviolet ray hardening photoresist, and hardening the second photoresist includes irradiating ultraviolet rays onto at least one of the first stamp substrate and the second stamp substrate.

6. The method of claim 1, wherein one of the first photoresist and the second photoresist includes a fluorine resin.

7. The method of claim 1, further comprising:
    coating a fluorine resin layer on the first photoresist pattern.

8. A method of manufacturing a nanoimprint stamp, the method comprising:
    forming a pattern on a surface of a master substrate;
    coating a first photoresist on one of the surface of the master substrate and a surface of a first stamp substrate;
    pressing the master substrate against the first stamp substrate to compress the first photoresist;

forming a first photoresist pattern on the first stamp substrate by hardening the first photoresist;
removing the master substrate;
depositing an etch barrier layer on a surface of a second stamp substrate;
coating a second photoresist on one of surfaces of the first photoresist pattern and the etch barrier layer;
pressing the first stamp substrate against the second stamp substrate to compress the second photoresist;
forming a second photoresist pattern on the second stamp substrate by hardening the second photoresist;
removing the first stamp substrate;
forming a hard mask by etching the etch barrier layer using the second photoresist pattern; and
etching the second stamp substrate using the hard mask as an etch mask.

9. The method of claim 8, wherein the etch barrier layer includes at least on of a metal, an oxide, and a nitride.

10. The method of claim 9, wherein the etch barrier includes one of a first metal comprising at least one of Cr, Ti, Ta, Pt, Au, and Mo and a metal oxide or a metal nitride that is formed by combining oxygen or nitrogen with the first metal.

11. The method of claim 10, wherein the etch barrier layer is formed to have a thickness in a range from about 1 nm to about 20 nm.

12. The method of claim 9, wherein the etch barrier layer includes one of $SiO_2$, ITO, and $Si_3N_4$.

13. The method of claim 8, wherein the master substrate is a silicon substrate.

14. The method of claim 8, wherein each of the first and second stamp substrates includes at least one of quartz, glass, and polymer.

15. The method of claim 8, wherein the first photoresist is an ultraviolet ray hardening photoresist, and hardening the first photoresist includes irradiating ultraviolet rays onto the first stamp substrate.

16. The method of claim 8, wherein the second photoresist is an ultraviolet ray hardening photoresist, and hardening the second photoresist includes irradiating ultraviolet rays onto at least one of the first stamp substrate and the second stamp substrate.

17. The method of claim 8, wherein one of the first photoresist and the second photoresist includes a fluorine resin.

18. The method of claim 8, further comprising:
forming a fluorine resin layer on the first photoresist pattern.

* * * * *